US008595449B2

(12) United States Patent
Kund et al.

(10) Patent No.: US 8,595,449 B2
(45) Date of Patent: Nov. 26, 2013

(54) MEMORY SCHEDULER FOR MANAGING MAINTENANCE OPERATIONS IN A RESISTIVE MEMORY IN RESPONSE TO A TRIGGER CONDITION

(75) Inventors: Michael Kund, Tuntenhausen (DE); Thomas Happ, Dresden (DE); Gill Yong Lee, Dresden (DE); Heinz Hoenigschmid, Poecking (DE); Rolf Weis, Dresden (DE); Christoph Ludwig, Langebruck (DE)

(73) Assignee: Qimonda AG, Munich (DE)

( * ) Notice: Subject to any disclaimer, the term of this patent is extended or adjusted under 35 U.S.C. 154(b) by 1291 days.

(21) Appl. No.: 12/202,581

(22) Filed: Sep. 2, 2008

(65) Prior Publication Data

US 2010/0058018 A1    Mar. 4, 2010

(51) Int. Cl.
*G06F 12/00* (2006.01)
*G06F 13/00* (2006.01)
*G06F 13/28* (2006.01)
*G11C 13/00* (2006.01)
*G11C 11/00* (2006.01)
*G11C 11/34* (2006.01)
*G11C 16/06* (2006.01)
*G11C 16/04* (2006.01)
*G11C 7/04* (2006.01)

(52) U.S. Cl.
USPC ........... 711/154; 365/148; 365/222; 365/163; 365/149; 365/185.25; 365/211; 365/113; 365/185.09; 365/189.07; 365/213; 711/106; 711/167

(58) Field of Classification Search
None
See application file for complete search history.

(56) References Cited

U.S. PATENT DOCUMENTS

| 7,609,576 | B2 * | 10/2009 | Watanabe et al. | 365/222 |
| 7,830,701 | B2 * | 11/2010 | Siau et al. | 365/148 |
| 2003/0204669 | A1 * | 10/2003 | Ranganathan et al. | 711/106 |
| 2005/0005218 | A1 * | 1/2005 | Braun | 714/733 |
| 2005/0018490 | A1 * | 1/2005 | Leconte et al. | 365/185.29 |
| 2008/0117663 | A1 * | 5/2008 | Philipp et al. | 365/148 |

* cited by examiner

*Primary Examiner* — Sanjiv Shah
*Assistant Examiner* — Marwan Ayash
(74) *Attorney, Agent, or Firm* — Edell, Shapiro & Finnan, LLC (57) ABSTRACT

An integrated circuit includes: a resistive memory having an array of resistive memory cells; a memory controller that controls operation of the resistive memory in accordance with external commands from an external device; and a memory scheduler coupled to the resistive memory and to the memory controller. The memory scheduler schedules internal maintenance operations within the resistive memory in response to trigger conditions indicated by at least one sensor signal or external command. The operation of the memory scheduler and performance of the internal maintenance operations are transparent to the external device and, optionally, transparent to the memory controller.

24 Claims, 8 Drawing Sheets

MEMORY SCHEDULER FOR MANAGING MAINTENANCE OPERATIONS IN A RESISTIVE MEMORY IN RESPONSE TO A TRIGGER CONDITION

BACKGROUND

Typically, reliability of data stored in memory devices is influenced by degradation of the storage levels used within memory cells to define different logical states (e.g., voltage levels, resistance levels, etc.). Such storage levels tend to degrade over time (e.g., due to leakage currents) or with temperature. To address this problem, DRAMs have internal refresh operations which guarantee via sense and write back operations that the stored information remains in each respective memory cell. For new non-volatile memory technologies such as phase change memory, conductive bridge memory, magnetic memory, and memories based on resistive switching in Transition Metal Oxide materials such as TiOx, NiOx, etc. (so called TMO memories), similar degradation mechanisms on various time scales have been observed as well.

Currently, products with high reliability are designed with additional bits and an error correction code (ECC) algorithm, which allow for detection and/or repair of failing memory cells. The memory cells required to store these additional bits lead to additional chip size and, moreover, give rise to delays in timings of operations due to the need to perform the ECC calculations. Of course, the storage levels in the memory cells containing these special bits tend to degenerate like the storage levels in the other memory cells in the memory array.

Memory devices with built-in self repair (BISR) operations have been proposed; however, this capability has the disadvantage of requiring greater redundancy overhead in order to avoid a gradual decrease of memory capacity.

It would be desirable to provide memory devices based on emerging memory technologies that reliably maintain storage levels over time while minimizing the overhead, delays, and chip size associated with ECC calculations and frequent refresh operations, which can be readily substituted for memory devices that employ current memory technologies such as DRAM and Flash architectures.

SUMMARY

Described herein is an integrated circuit that includes: a resistive memory having an array of resistive memory cells; a memory controller that controls operation of the resistive memory in accordance with external commands from an external device; and a memory scheduler coupled to the resistive memory and to the memory controller. The memory scheduler schedules internal maintenance operations within the resistive memory in response to trigger conditions indicated by at least one sensor signal or external command. The operation of the memory scheduler and performance of the internal maintenance operations are transparent to the external device and may also be transparent to the memory controller.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

The concepts of the invention will be described in greater detail in the context of illustrative, non-limiting embodiments with reference to the accompanying drawings. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various embodiments described herein may be combined with each other, unless specifically noted otherwise.

Emerging memory technologies such as resistive memory (e.g., resistive random access memories such as phase change random access memory (PCRAM), conductive bridge random access memory (CBRAM), and magnetic random access memory (MRAM)) offer certain advantages over DRAM, Flash and other conventional types of memory devices in terms of switching speeds, size, power consumption, and non-volatility. To optimize performance and reliability of such memories, internal maintenance operations can be performed to ensure that data storage levels are within acceptable ranges and that memory cells are operating properly.

The system described herein includes a memory scheduler for a memory device, which evaluates sensor signals and external commands for operating the memory device to intelligently schedule internal maintenance operations for the memory device, such as maintenance operations suitable in memories based on emerging technologies. While ensuring reliable and efficient operation of the memory device, these internal maintenance operations do not directly impact operation of the memory device as viewed from an external controller, CPU, or host device. For example, the external scheduling of read and write operations and the timing and response of the memory device to read and write commands are not affected by the scheduling of internal maintenance operations. Thus, external commands designed to operate and access the memory device are used to trigger internal maintenance operations that are "transparent" to or "hidden" from the external system issuing the commands (i.e., the external system does not need to be aware of or informed of the timing or occurrence of internal maintenance operations and does not need to know that certain commands or combinations of commands and/or conditions trigger these operations).

As used herein, the term "transparent" refers to the fact that the memory scheduler and its operations are entirely hidden from or unknown to any external device which uses the memory, including the host device, its CPU supplying commands to the memory controller, and optionally the memory controller itself (e.g., where the memory controller is not integrated into the memory or the memory scheduler). This means that, from a signaling standpoint, external devices do not need to know of the existence of the memory scheduler, and the external commands supplied to control the memory are not intended to control the memory scheduler or to trigger the internal maintenance operations managed by the memory scheduler. External devices are entirely unaware of the operation of the memory scheduler, the scheduling performed, and the execution, status, and completion of the internal maintenance operations. Another aspect of being transparent or hidden is that the memory scheduler does not report scheduling, execution, status, or completion of internal maintenance operations to the external device. The memory scheduler and the internal maintenance operations are also transparent or hidden in the sense that the internal maintenance operations are scheduled such that the interactions of the memory with the memory controller and external CPU or host device (e.g., the timing of memory operations and responses of the memory) are not affected by the internal maintenance operations. Thus, for example, unlike the memory scheduler described herein, a conventional memory controller is not transparent to an external device such as a CPU, since CPU commands are designed to instruct the memory controller, and the memory controller's operations are evident to the CPU in that the memory controller and/or the memory supplies output signals to the CPU in response to command signals (e.g., output read data, status information, etc.).

The memory scheduler essentially operates as a state machine that receives incoming commands and detects external activities/signals such as battery charging in mobile devices, idle status, hibernation modes, temperature, power off or power on routines, etc., and depending on the present state and incoming signals, triggers internal activities like built in self test (BIST), build in self repair (BISR), and read/write cleanup operations in order to narrow distribution functions (voltage levels, resistance levels, etc.) that may have broadened over time. By intelligent scheduling of internal (on chip) activities (during idle modes or battery charging, etc.), the distribution of the stored levels can be narrowed, which improves the sensing signal (improved signal margin), which in turn leads to higher storage reliability. Periods of battery charging in mobile devices are particularly attractive for these operations, since power consumption plays a greatly reduced role during charging and memory activity is typically low or the device is off. By implementing these internal maintenance operations, the reliability of the memory cells can be improved, and the use of additional bits for ECC operations may no longer be necessary. These techniques may also extend memory lifetime. As previously explained, the internal maintenance operations can be hidden activities, meaning the performance of the memory in terms of timing and interaction with a memory controller or host device is not negatively influenced.

The memory scheduler can be resident on a memory chip or can be on a separate chip or processor (e.g., part of a separate memory controller) or integrated into an interface between a memory controller and a memory chip. Regardless of the particular arrangement, the memory scheduler can be considered an "internal" scheduler in the sense that the host device, processor, or CPU that is using the memory device to store and retrieve data is not directly involved with or aware of the memory scheduler or the internal activities being scheduled. The host device, and possibly the memory controller, can be considered "external" in that they interact with the memory device via a set of external commands that control operation of the memory device, but are not involved with and do not attempt to control certain types of internal maintenance operations. Nevertheless, the memory scheduler is capable of using certain external commands or signals to trigger scheduling of internal maintenance operations that improve performance and reliability in emerging technology memory devices.

The internal memory scheduler can be designed to take advantage of benefits provided by emerging memory technologies to enable such memories to enter markets where typical applications are based on the use of memory devices with established technologies, in order to take advantage of benefits of emerging technologies in these contexts. For example, PCRAM has very fast switching speeds that are comparable to DRAM, but with the advantage of non-volatility. Nevertheless, stable storage levels in resistive memory devices may require some maintenance to ensure sufficient signal-to-noise ratios for reliable retention/reading of stored data, particularly with multi-bit/level memory cells. By intelligently scheduling such maintenance tasks within a memory device in a manner that is transparent to an external controller or host device (e.g., during periods typically used for DRAM refresh operations or during idle times), emerging memory technologies can be used as drop-in replacements for conventional memories without requiring modification of the host device or system.

Figure 1:
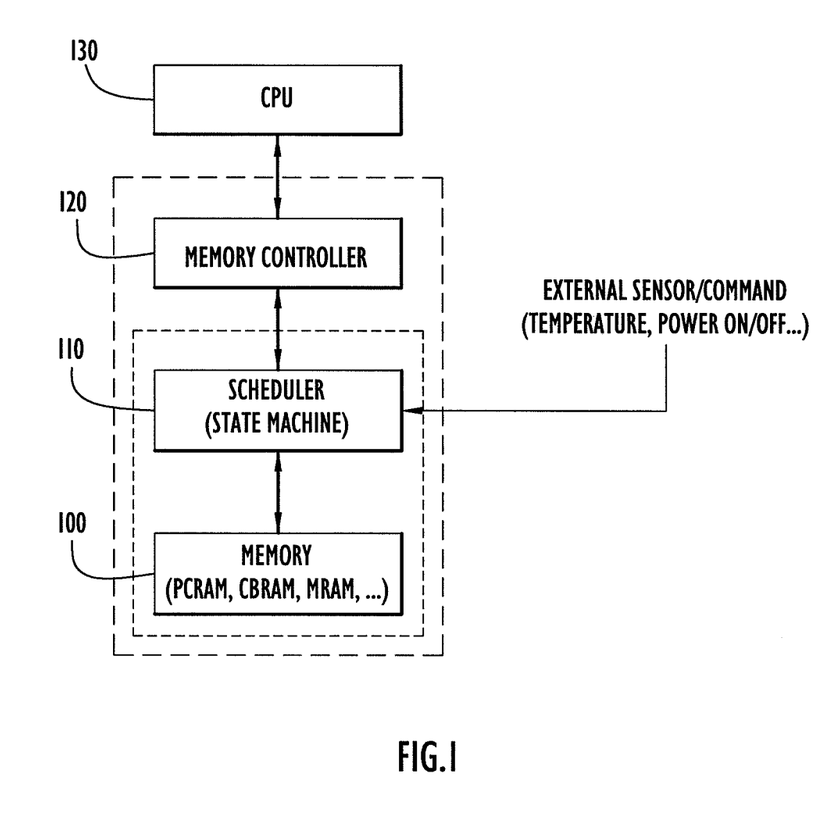
FIG. 1 is a conceptual block diagram illustrating an embodiment of a memory system including a memory scheduler for initiation and control of internal maintenance operations in a memory.

FIG. 1 is a block diagram of a system employing a memory scheduler 110 for controlling internal maintenance operations of a memory 100 according to an embodiment of the invention. Memory 100 provides storage of data for a host device and may include an array of memory cells each of which is capable of being configured in at least two states which represent information (e.g., a first logical state that represents a binary "1" and a second logical state that represents a binary "0").

Memory 100 can employ an emerging memory technology such as resistive memory technology (e.g., a resistive random access memory). For example, each memory cell in the array can include a resistance changing storage element accessible by a word line and bit line and a selection device such as a transistor or diode-like structure. By way of a non-limiting example, the resistance changing storage elements of the memory cells can be phase change storage elements that comprises a phase change material that may be made up of a variety of materials. Generally, chalcogenide alloys that contain one or more elements from Group VI of the periodic table are useful as such materials. In one embodiment, the phase change material is made up of a chalcogenide compound material, such as GeSbTe, SbTe, GeTe, or AgInSbTe. In another embodiment, the phase change material is chalcogen free, such as GeSb, GaSb, InSb, or GeGaInSb. In other embodiments, the phase change material can be made of any suitable material including one or more of the elements Ge, Sb, Te, Ga, As, In, Se, C, and S. Other resistance changing materials that can be used include a resistive thin film of a resistance-reversible material such as colossal magnet resistive thin film (e.g., PCMO thin film ($Pr_{0.7}Cr_{0.3}MoO_3$)), oxidation films having a Perovskite structure (e.g., $Nb_2O_5$, $TiO_2$, $TaO_5$, NiO), or oxidation film such as $SrTiO_3$:Cr. However, it will be appreciated that the invention is not limited to any particular material or classes of materials, and virtually any substance capable of being configured in plural resistance states can be employed. Moreover, other types of resistive memories such as MRAM, TMO and CBRAM technologies can be employed.

As indicated by the dashed line enclosing memory 100 and memory scheduler 110, memory scheduler 110 may be resident on the same integrated circuit device as memory 100, such as on a memory chip. A memory controller 120 serves as an interface between a CPU 130 of the host device and memory 100 and receives commands for operating memory 100. For example, memory controller 120 may receive from CPU 130, over suitable buses, a write access command along with write data to be stored and a memory address indicating a location where the data is to be stored. Memory controller 120 interprets the write command and controls a write circuit to store the data in memory 100 at the designated address. Similarly, in response to a read access command, memory controller 120 controls sense circuits to read the states of memory cells designated by a specified memory address and supplies the read data to CPU 130 via an output bus. Memory controller 120 also receives and acts upon other external commands typically included in a command set for controlling a memory device, such as power up/down commands, idle/active mode commands, mode register set, etc.

In a conventional architecture, a host device's CPU and, in turn, the memory controller demand that the memory perform certain activities and interact with the memory using a set of commands. However, considering the intricacy of the internal architecture and internal operations of memory devices, the level of intelligence provided by the interface between the host system and its memory devices is relatively crude. In the simplest hardwired case, a 32-bit or 64-bit bus is employed, for example. According to the scheme described herein, the memory scheduler within a memory (or between the memory and external devices) can increase reliability, increase sense amplifier signal-to-noise ratios, and decrease power consumption without changing the activity or timing performance of the memory as seen from the external system or host device. The internal memory scheduler provides a build-in logic that uses incoming information from sensors and/or external signals to perform intelligent scheduling of hidden tasks and operations in a coordinated manner that is transparent to the external system that employs the memory.

The host device represented in FIG. 1 by CPU 130 can be any of a wide variety of devices including but not limited to a computer (e.g., desktop, laptop, handheld), portable electronic device (e.g., cellular phone, personal digital assistant (PDA), MP3 player, video player, digital camera), or any other suitable device that uses memory.

Memory scheduler 110 receives at least certain commands supplied by memory controller 120 to memory 100 and uses these commands, along with sensor signals or observations of conditions, to determine whether there is an opportunity to perform internal maintenance operations within memory 100. As suggested by the signal flow arrangement shown in FIG. 1, signals from memory controller 120 can be passed through memory scheduler 110 to memory 100, allowing scheduler 110 to receive and evaluate any signals that may be relevant to scheduling of internal maintenance operations before relaying signals to memory 100. Optionally, memory scheduler 110 can be configured to receive only those signals or commands from memory controller 120 which may be relevant to internal scheduling of maintenance operations and other signals from memory controller 120 could be routed directly to memory 100. In general, the invention is not limited to any particular signal routing or bus architecture, provided memory scheduler 110 receives the information required to perform internal scheduling of maintenance tasks.

Optionally, as indicated by the dashed line enclosing memory 100, memory scheduler 110, and memory controller 120, all of these components can be resident on a common integrated circuit device such as a memory chip or a memory module, such as a dual in-line memory module (DIMM) card that includes a plurality of memory chips controlled by a separate memory controller. According to another option, memory controller 120 may be external to a memory chip containing memory device 100 and memory scheduler 110. Consider, for example, a DIMM with eight memory chips. One option would be to have eight schedulers, one on each memory chip, and one memory controller on the DIMM for controlling all eight memory chips. Another option would be to have one scheduler on the DIMM, which serves all memory chips, or two schedulers that serve four memory chips each. In general, memory device 100 is not limited to any particular architecture or application, and can be configured to suit the requirements of the host device. Thus, the invention is not limited to configurations in which the memory scheduler 110 or memory controller 120 is arranged on the same chip or module as memory 100.

Figure 2:
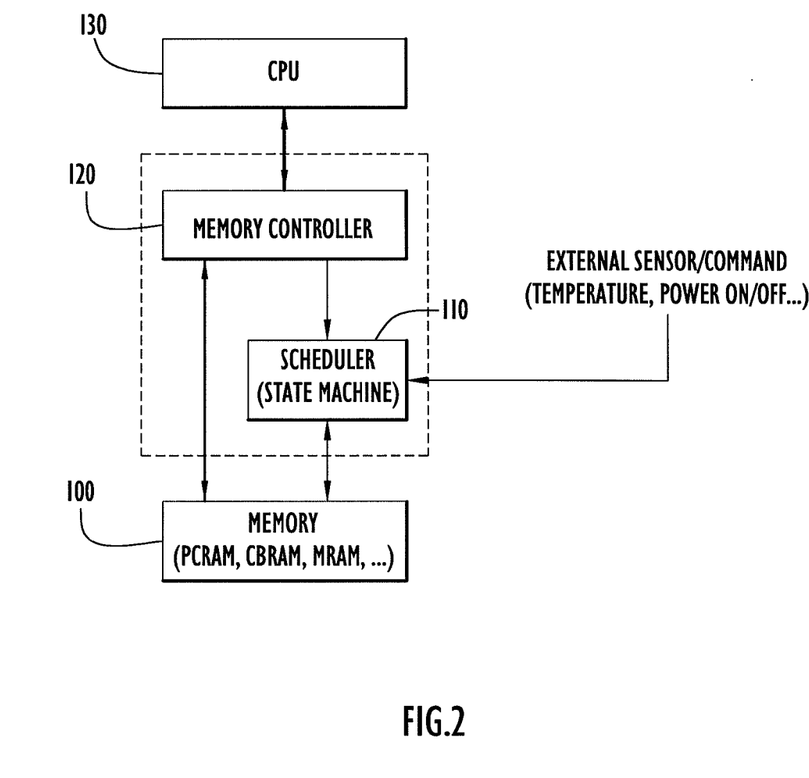
FIG. 2 is a conceptual block diagram illustrating another embodiment of a memory system including a memory scheduler for scheduling internal maintenance operations in a memory.

Memory scheduler 110 and memory controller 120 can each include a microprocessor, microcontroller, state machine, or other suitable logic circuitry for controlling the operation of memory 100. In general, memory schedule 110 and memory controller 120 can be implemented in any combination of hardware and/or software and are not limited to any particular architecture. According to one option, memory scheduler 110 can be integrated into memory controller 120 or more closely coupled to memory controller 120, as illustrated in FIG. 2 with a dashed box around memory scheduler 110 and memory controller 120. FIG. 2 also illustrates that other interconnections or bus arrangements are possible. Here, memory controller 120 directly interacts with memory 100, while memory scheduler 110 receives or interprets required signals from memory controller 120 and supplies internal control signals to memory 100 for initiating internal maintenance tasks.

Regardless of the particular architecture, the operations, decisions, and scheduling performed by memory scheduler 110 as well as the internal maintenance operations performed within memory 100 in response to commands from memory scheduler 110 are "invisible" or transparent to any circuitry beyond an external interface to memory 100. For example, in the configuration shown in FIG. 1, CPU 130 would be considered an external device that commands memory 100 to operate in a certain manner but is not "aware" of the activities of scheduler 110 or the internal maintenance operations. Depending on the architecture of a particular memory device or system, memory controller 120 can also be an external device or external circuitry in the sense that memory controller 120 also would not be aware of the activities of scheduler 110 or of the internal maintenance operations.

Note that, in FIGS. 1 and 2, the lines extending between memory 100, memory scheduler 110, and memory controller 120 have arrows at both ends, suggesting signals traveling in both directions. However, it should be clarified that where memory controller 120 is "external," any signals supplied to the external memory controller from memory scheduler 110 are essentially pass-through signals originating from memory 100. Since memory scheduler 110 and its operations are transparent to external devices that operate or control memory 100, memory scheduler 110 does not supply any signals back to an external memory controller that relate to scheduling, execution, or status of internal maintenance operations (i.e., from the perspective of the external memory controller and host system, the memory scheduler does not exist). Likewise, while certain commands from memory controller 120 for controlling memory 100 are used by memory scheduler 110 to scheduler or trigger certain internal maintenance operations, since memory scheduler is "transparent," neither CPU 130 nor memory controller 120 issues commands or signals intended to control or instruct memory scheduler 110.

Referring again to FIG. 1, in addition to receiving commands from memory controller 120, memory scheduler 110 may also receive external commands or external sensor signals from external sources other than memory controller 120. For example, a temperature sensor may provide a signal indicating the temperature in the vicinity of (or within) memory 100 or may received a power on/off signal or a battery charging indication from a source other than through the interface with memory controller 120. The depiction in FIG. 1 of these signals as "external" is conceptual to indicate that sources of information may be provided to memory scheduler 110 other than through memory controller 120. Note, for example, that a temperature sensor providing "external" temperature data could actually be resident on or within memory 100 rather than physically external. Further, power on/off signals or battery charging signals optionally could be received through the interface with memory controller 120. Regardless of the particular type or origin of these additional external commands or sensor signals, they can be used by memory scheduler 110 along with commands from memory controller 120 to schedule internal maintenance operations.

Figure 3:
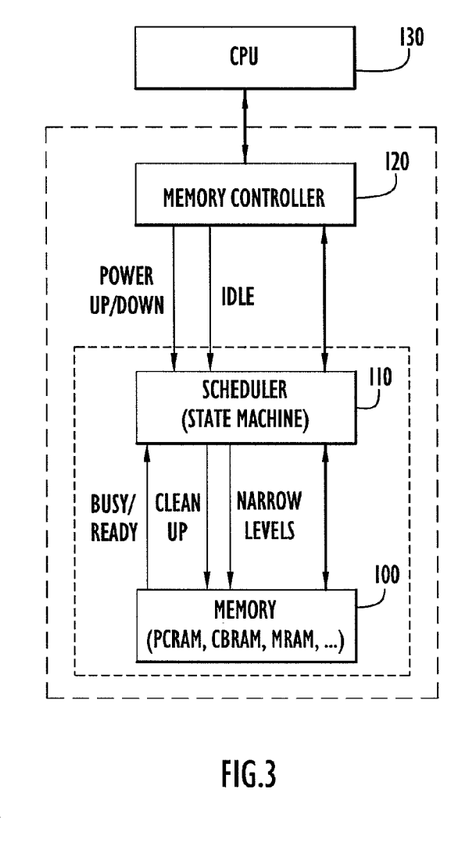
FIG. 3 is a block diagram illustrating specific signals exchanged among a memory controller, a memory scheduler, and a memory for triggering internal maintenance operations within the memory.

FIG. 3 provides a more detail diagram of certain signals supplied between memory controller 120, memory scheduler 110, and memory 100 for enabling scheduling of certain internal maintenance operations. The thicker lines extending between memory controller 120, memory scheduler 110, and memory 100 represent the collection of signals passed between these circuits, while specific signals involved in triggering certain internal maintenance operations are separately shown in FIG. 3 for purposes of illustration. In particular, standard signals such as Power Up/Down and Idle are supplied by memory controller 120. These signals are received and interpreted by memory scheduler 110 to schedule internal tasks. Based on operating conditions determined from these signals (and possibly other external signals), memory scheduler 110 can initiate internal maintenance tasks such as "narrow levels" and "clean up" via internal commands sent to memory 100, as described below in greater detailed. Memory 100 can inform memory scheduler 110 of the status of tasks (e.g., completed or ongoing) via a busy/ready signal.

FIG. 3 illustrates that the concept that signals typically used in established memory technologies for operational purposes (idle, power up/down, etc.) can also be interpreted by an internal memory scheduler of an emerging technology memory and used for the additional purpose of triggering the scheduling of internal tasks, thereby taking advantage of capabilities and characteristics of emerging technologies that allow modifications and activities to be performed at suitable times that will not disrupt use of the memory by an external device. As explained below in specific examples, certain combinations of signals (e.g., an idle state and battery charging) can indicate acceptable conditions for performing certain tasks and can be used to trigger scheduling of those tasks.

Figure 4:
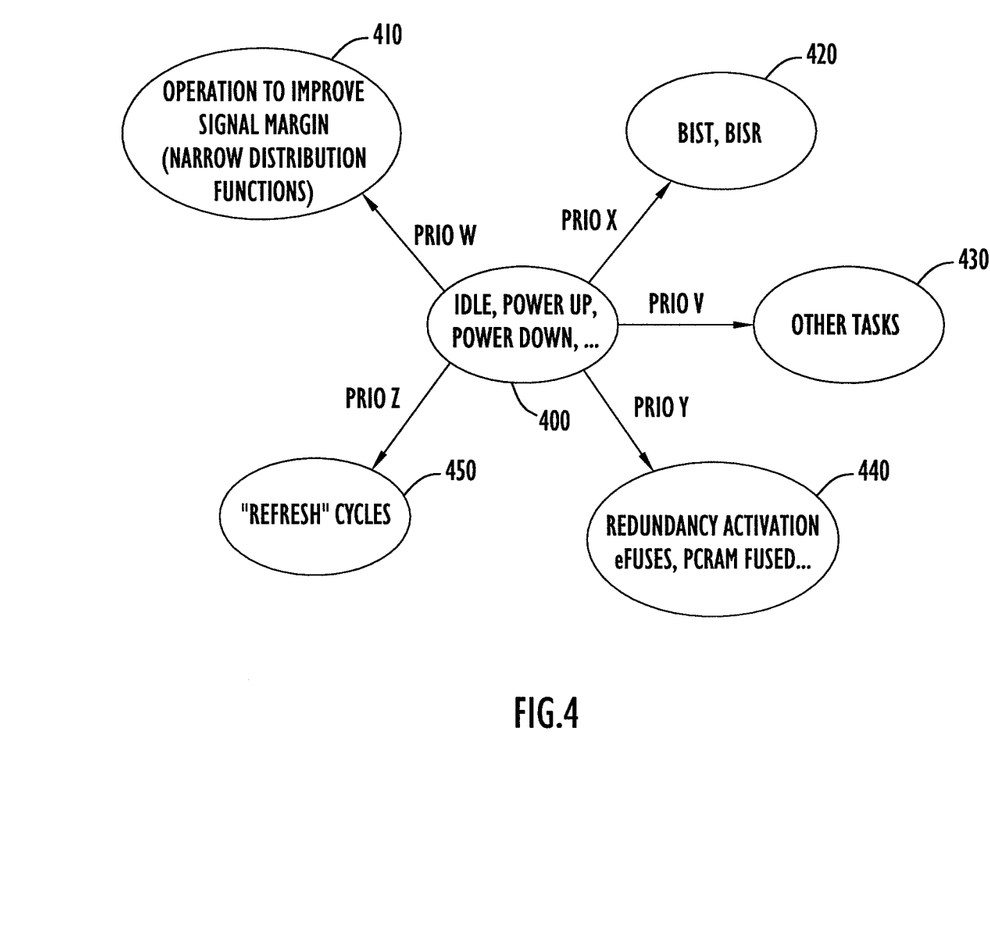
FIG. 4 is a state diagram illustrating examples of internal maintenance operations that can be performed in response to certain signals or conditions.

FIG. 4 is a state diagram illustrating a number of internal maintenance operations that can be initiated by the memory scheduler under certain conditions indicated by one or a combination of external commands and sensor signals. State 400 shown in the center of FIG. 4 represents one or more initial states from which the memory can transition to a state in which an internal maintenance operation is being performed. Thus, state 400 could be one of a number of states the memory would be in if there were no memory scheduler scheduling internal maintenance operations, i.e., one of the states the memory controller could put the memory in, such as idle, power up, power down, sleep mode, nap mode, etc. From initial state 400, the scheduler can trigger a number of different activities, each with a certain priority (e.g., priorities V, W, X, Y, and Z as shown in FIG. 4). The various priorities can be set and modified by the memory scheduler. Optionally, the memory scheduler can operate as an arbiter which uses the task priorities to schedule internal maintenance operations in a sequence that reflects the importance or necessity of certain tasks or the elapsed time since a task was last performed. For example, if a temperature sensor indicates an elevated temperature, the priority of the task of cleaning up storage levels affected by higher temperatures can be increased so that this task is performed sooner that it otherwise would be. According to one option, the priority of a particular task may increase over time to ensure that each task is eventually carried out, and the priority of the task can be reset to a lower value once the task is completed.

A variety of trigger conditions or combinations of conditions can be used by the memory scheduler to determine that circumstances are appropriate to carry out certain tasks (internal maintenance operations). Examples of signals or conditions that may be used to trigger internal maintenance operations include, but are not limited to: idle mode, standby mode, nap mode, power down mode, input/output (I/O) inactivity for a certain period of time (e.g., 100 ms), a power up sequence, a power down sequence, a sleep mode request, an operating system or CPU signal, a battery charging condition, or a user-initiated signal. These criteria can be advantageously combined to indicate favorable conditions for performing internal maintenance operations, e.g., battery charging and I/O inactivity.

Optionally, the memory controller can interrupt or turn off an internal maintenance operation that is not yet completed based on certain operating states or conditions occurring (e.g., low battery, power saving mode, etc.). Such states or conditions can be conveyed to the memory scheduler via receipt of an external command or signal originating from the host system or CPU or by a user command, for example.

Referring again to FIG. 4, from initial state 400, the memory scheduler can, in response to certain trigger conditions, transition the memory to a state 410 in which an internal maintenance operation is performed for improving signal margins experienced during read operations, by narrowing the distribution of stored signal levels present in the memory cells of the memory array. Resistive memories such as PCRAM, CBRAM, TMO, and MRAM utilize the resistance value of a memory element to store one or more bits of data. For example, a memory element programmed to have a high resistance value may represent a logical "0" data bit value, and a memory element programmed to have a low resistance value may represent a logical "1" data bit value. Of course, this convention is arbitrary and the opposite convention could be used (i.e., high resistance="1"; low resistance="0"). Typically, the resistance value of the memory element is switched electrically by applying a voltage pulse or a current pulse to the memory element.

Phase change memory is one type of resistive memory which uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistance than the crystalline state. The amount of crystalline material coexisting with amorphous material in the phase change material of one of the phase change memory elements thereby defines two or more states for storing data within a memory cell based on different electrical resistance levels. In a phase change random access memory (PCRAM), a phase change memory cell can be "reset" to a high-resistance amorphous state by heating the phase change material and then quenching the material. To "set" the phase change memory cell to a lower-resistance crystalline state, the material is heated and then slowly cooled down. These phase changes may be induced reversibly such that a memory cell can be written to many times without degradation.

Whether the storage levels are defined by different resistance levels or other measurable levels such as voltage levels, even in non-volatile emerging memory technologies there may be degradation of the storage levels over time. The storage levels of individual memory cells may vary from the ideal values used to represent certain logical states, such that a distribution of storage level values exists for the memory cells of an array. This distribution of storage levels may tend to broaden over time, with the storage levels of some of the memory cells exceeding a threshold beyond which the signal margin becomes unreliably small during read operations. An internal maintenance operation can be performed to narrow the storage level distributions within the memory to ensure adequate signal margin when reading the contents of memory cells.

Figure 5A:
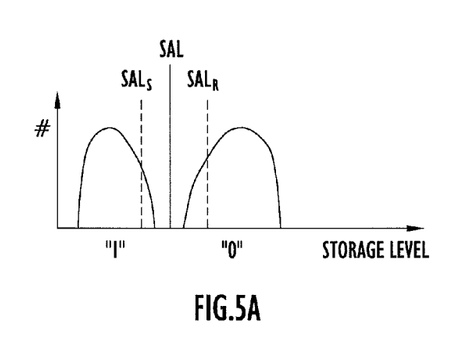
FIGS. 5A-5C illustrate operations performed to improve (narrow) the distribution of signal levels within the memory cells of a memory.

FIG. 5A is a graph illustrating broadened storage level distributions that may exist prior to performing a "narrow levels" internal maintenance operation. The distributions essentially represent an aggregation of the storage levels (e.g., voltages or resistances) of the memory cells within the array or a portion of the array, with the height of the distribution at any point indicating the number of memory cells having that storage level. In this example, the storage levels are represented relative to a sense amplifier level (SAL), which can be a voltage, resistance, or current within the sense amplifier circuitry. A storage level below a certain SAL (shown in FIG. 5A with a vertical line between the two distributions) will be interpreted as logical "1" and a storage level above this SAL will be interpreted as a logical "0." To ensure a signal margin adequate to avoid errors, the storage level for a logical "1" bit should be below a lower SAL set threshold ($SAL_S$), while the storage level for a logical "0" bit should be above a higher SAL reset threshold ($SAL_R$). The distributions shown in FIG. 5A indicate that at least some of the memory cells have logical "1" storage levels that are above $SAL_S$ and logical "0" storage levels below $SAL_R$, resulting in an inadequate signal margin and an increased risk of bit errors during read operations for some of the memory cells.

Figure 5B:
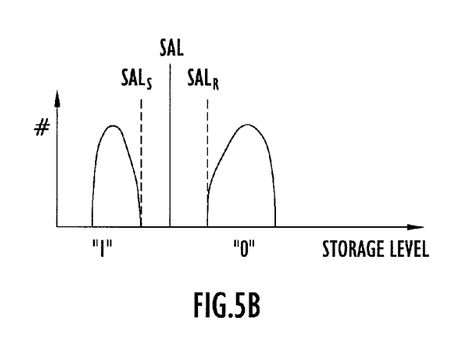
Figure 5C:
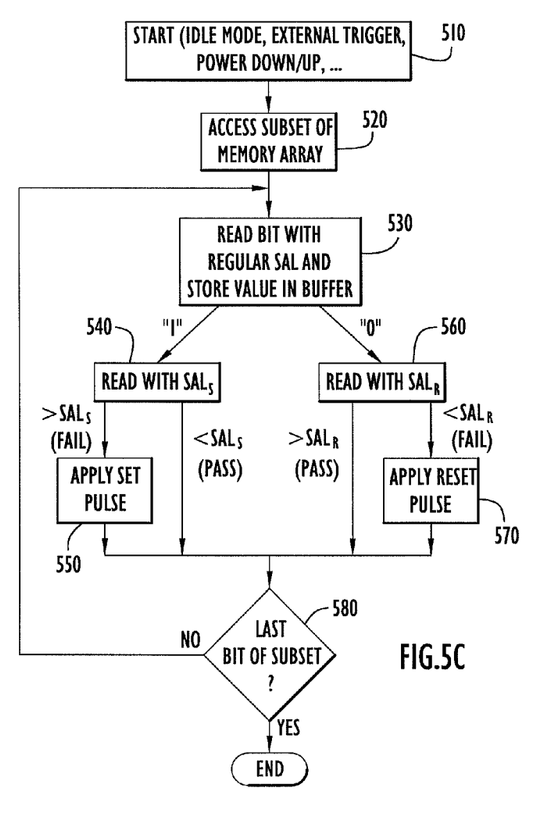

FIG. 5C is a flow chart illustrating a "narrow levels" operation that can be performed in the memory to produce acceptable storage level distributions such as those shown in FIG. 5B. Upon the memory scheduler identifying suitable trigger condition(s) in operation 510 (e.g., idle mode, power up/down, battery charging, or other external trigger commands or signals), at least a portion or subset of the memory array is accessed (operation 520) for performing the internal maintenance operation. In operation 530, the bit stored in a memory cell of the memory array subset is read by comparing the storage level to the regular SAL. If the storage level is below the SAL value, for example, the bit is read as a logical "1." If the storage level is above the SAL, the bit is read as a logical "0." The value of the read bit is stored in a buffer. If the read bit is a logical "1," in operation 540, the storage level is compared to the lower $SAL_S$ threshold (e.g., the read operation can be repeated with $SAL_S$ rather than SAL). If the storage level is greater than the $SAL_S$ threshold, the logical "1" storage level is too high, and a "set" operation is performed on the memory cell (e.g., by applying a "set" pulse) to establish a lower storage level in the memory cell (operation 550). If, on the other hand, the storage level is below the $SAL_S$ threshold, the storage level is acceptable, and no set operation is required.

If, in operation 530, the bit is read as a logical "0," in operation 560, the storage level is compared to the higher $SAL_R$ threshold (e.g., the read operation can be repeated with $SAL_R$ rather than SAL). If the storage level is less than the $SAL_R$ threshold, the logical "0" storage level is too low, and a "reset" operation is performed on the memory cell (e.g., by applying a "reset" pulse) to establish a higher storage level in the memory cell (operation 570). If, on the other hand, the storage level is above the $SAL_R$ threshold, the storage level is acceptable, and no reset operation is required.

Once the storage level of a memory cell has been evaluated and, if necessary, has been "set" or "reset" to establish an acceptable storage level, in operation 580 a determination is made as to whether any other memory cells require evaluation in the portion or subset of the memory on which the "narrow levels" operation is being performed. If so, the process is repeated for each memory cell until all the memory cells in the subset have been evaluated. While FIG. 5C shows this process as being performed on a bit-by-bit (i.e., cell-by-cell) basis for purposes of illustrating the concept, it will be appreciated that the process can be performed in parallel on the stored bits of any number of memory cells, such that reading, evaluating, and correcting of multiple memory cells can be performed at the same time (e.g., all the cells connected to a particular word line can be accessed at once so that a number of bit lines are evaluated simultaneously). Once the "narrow levels" operation has been completed, the improved distributions of storage levels are more closely clustered around the ideal storage level values for representing the logical states, resulting in greater signal margins during read operations and a greatly reduced risk of bit errors, as shown in FIG. 5B.

A similar type of internal maintenance operation can be triggered by a high temperature condition detected by a suitably placed temperature sensor which supplies a temperature signal to the memory scheduler. With emerging memory technologies such as PCRAM, high temperature conditions can cause a storage element in a high-resistance amorphous state (a "reset" logical "0" state) to gradually become more crystalline, resulting in a decreased resistance of the storage element. With high temperature in this type of PCRAM, only one of the two states is prone to degradation (the high resistance "reset" state), because the phase change material may crystallize over time, whereas the crystalline state is thermodynamically more stable and will not degrade. Consequently, the internal maintenance operation performed in response to an elevated temperature condition may involve "cleaning up"

the storage level distribution of memory cells storing only one of the two logical states, in this case the high resistance "reset" state.

Figure 6A:
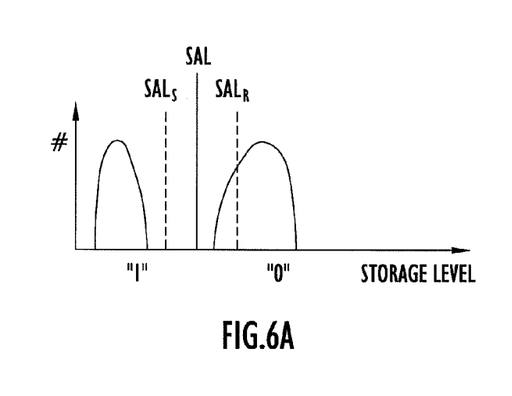
FIGS. 6A-6C illustrate operations performed to clean up the distribution of signal levels in response to an elevated temperature condition.

FIG. 6A illustrates storage level distributions for "0" and "1" bits stored in a memory exposed to elevated temperatures. Note that the distribution of the storage levels of the memory cells with "1" bits remains acceptably below the $SAL_S$ threshold, whereas the distribution of the storage levels of the memory cells with "0" bits is broadened such that the storage levels of at least some of the memory cells are below the $SAL_R$ threshold, resulting in potentially insufficient signal margin.

Figure 6B:
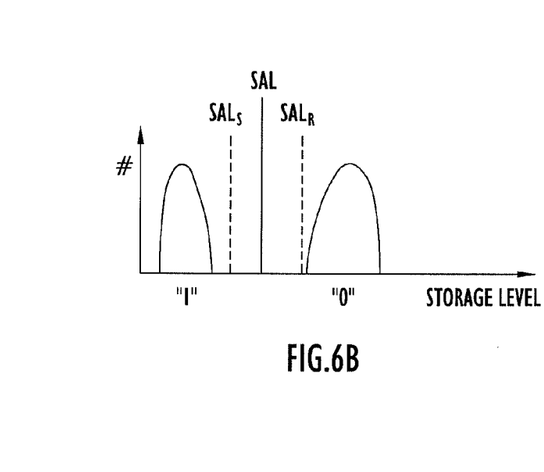
Figure 6C:
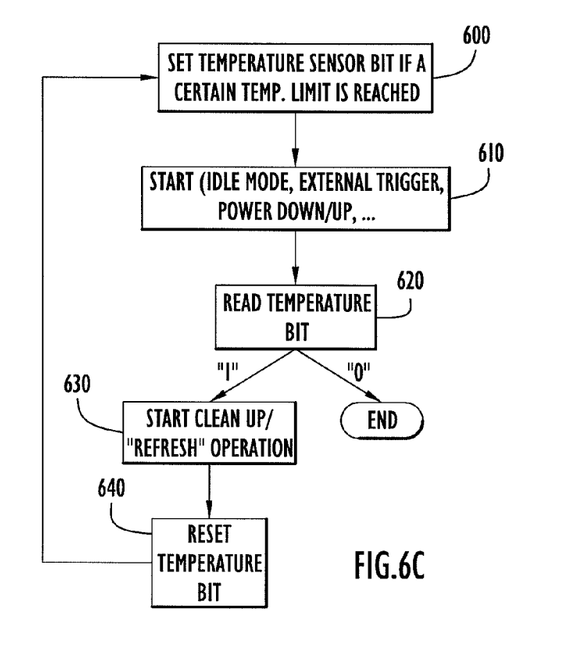

FIG. 6C is a flow chart illustrating the triggering and carrying out of an internal "clean up" operation that can be performed in the memory to restore storage level distributions to acceptable levels such as those shown in FIG. 6B. It will be appreciated that the operations shown in FIG. 6C are only one example of how this process can be performed in order to illustrate the concept, and other schemes can be used to carry out the "clean up" task. In operation 600, an elevated temperature condition causes a temperature sensor bit to be set to provide an indication to the memory scheduler. Upon the memory scheduler identifying suitable trigger condition(s) in operation 610 (e.g., idle mode, power up/down, battery charging, or other external trigger commands or signals), the memory scheduler can read the temperature bit (operation 620). If the temperature bit has been set (e.g., to a logical "1" state) in response to an elevated temperature condition, the memory scheduler commands the clean up or "refresh" operation to be performed. On the other hand, if the temperature bit indicates a normal temperature condition (e.g., a logical "0" state), no clean up operation is scheduled.

Note that any of a variety of mechanisms can be used for identifying elevated temperature conditions and triggering of the clean up task. For example, rather than the memory scheduler checking a temperature sensor bit after other trigger conditions have been met, the temperature sensor can send a signal to the memory scheduler when an elevated temperature condition exists. Another option is for the temperature sensor to send temperature readings to the memory scheduler and have the memory scheduler determine from the readings whether the exposure to elevated temperatures is sufficient to require a "clean up" operation.

The "clean up" operation 630 can be performed in a number of different ways. For example, the operation can be carried out in a manner similar to the "narrow levels" process shown in FIG. 5C. In particular, the storage level of each memory cell is read with the regular SAL and determined to be a logical "0" or "1." If the bit is read as a logical "0," a reset pulse is applied to the memory cell if the storage level is less than the $SAL_R$ threshold, and no action is taken if the storage level is above the $SAL_R$ threshold.

Unlike the process shown in FIG. 5C, however, in the example of the distribution shown in FIG. 6A, where only the logical "0" distribution degrades, if a bit is determined to be a logical "1" by reading the bit with the regular SAL, no further action is required in operation 630, since only the logical "0" distribution requires improvement. Of course, in certain types of memories it is possible that both the logical "0" and the logical "1" distributions degrade in the presence of elevated temperatures, in which case in operation 630 of FIG. 6C both "0" bits and "1" bits would be evaluated and corrected as necessary in the manner shown in FIG. 5C.

Another option for performing the "clean up" operation 630 in FIG. 6C is to read the bit stored in each memory cell and perform a reset operation on any memory cell storing a logical "0" bit. This approach essentially assumes that the elevated temperature condition will have degraded the logical "0" storage level in each of the memory cells to some degree and avoids the step of reading the storage level of the "0" bits with an $SAL_R$ value before deciding whether to apply a reset pulse. In other words, a reset pulse is automatically applied to the memory cells storing "0" bits without determining the extent to which the storage levels of particular cells have degraded. This approach is more analogous to the "refresh" operation typically performed in a volatile memory such as a DRAM, where memory cell capacitors storing a charge are automatically recharged during a refresh operation irrespective of the charge level prior to the refresh operation. The "refresh" operation described here is unlike a typical DRAM refresh operation in that the operation need not necessarily be performed frequently or periodically. Again, in the example in FIG. 6A, only the memory cells storing logical "0" bits need to be "cleaned up" or "refreshed"; however, in certain types of memories in which both logical states degrade with temperature, it may be appropriate to apply reset pulses to each of the memory cells storing logical "0" bits as well as set pulses to each of the memory cells storing logical "1" bits.

In the implementation shown in FIG. 6C, once the "clean up" operation is completed, the temperature sensor bit can be reset (operation 640), so that the "clean up" operation will not be performed again until another elevated temperature condition is detected. As previously noted, in other implementations, a temperature sensor bit need not be used, and the temperature sensor can send a high-temperature indication signal or temperature data to the memory scheduler, and the memory scheduler can schedule "clean up" operations as required in accordance with the priority scheme and availability of suitable conditions (e.g., idle, battery charging, etc.).

As shown in FIG. 6B, once the "clean up" operation has been completed, the improved distribution of "0" bit storage levels is more closely clustered around the ideal storage level value, resulting in greater signal margins during read operations and a greatly reduced risk of bit errors. In this example, the distribution of "1" bit storage levels remains unchanged; however, as previously explained, it is also possible to "clean up" both the "0" and "1" distributions, which would be desirable if the storage levels of both "0" and "1" bits tend to degrade from high-temperature conditions.

Figure 7A:
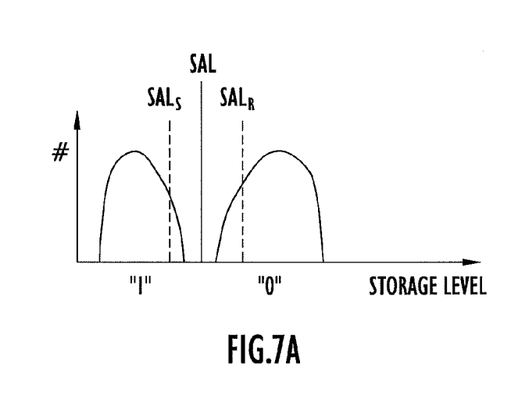
FIGS. 7A-7C illustrate operations performed to clean up the distribution of signal levels in response to a number of operation cycles being exceeded.

Another possible source of storage level degradation in memories based on emerging technologies is the repeated accessing or activation of memory cells. After a high number of cycles, the distribution of storage levels might be broadened to the point that the storage levels of at least some memory cells will produce insufficient signal margin during read operations, as shown in FIG. 7A. Here again, depending upon the particular type of emerging technology involved, the memory may be prone to degradation of storage levels of both "0" and "1" bits due to a high number of cycles, resulting in the broadening of both the "0" and "1" bit storage level distributions as shown in the example in FIG. 7A. In other cases, a high number of cycles may cause a greater degradation in storage levels of one of the logical states than in another logical state (e.g., like the effect shown in FIG. 6A).

Figure 7B:
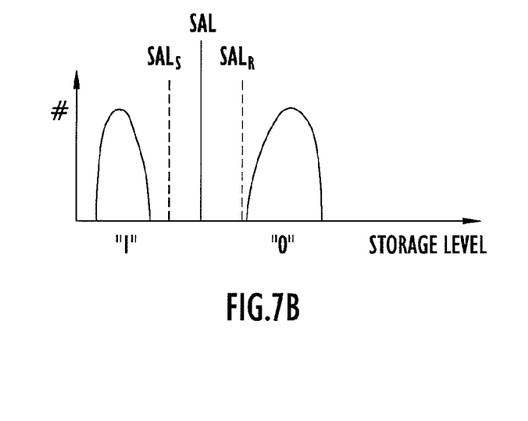
Figure 7C:
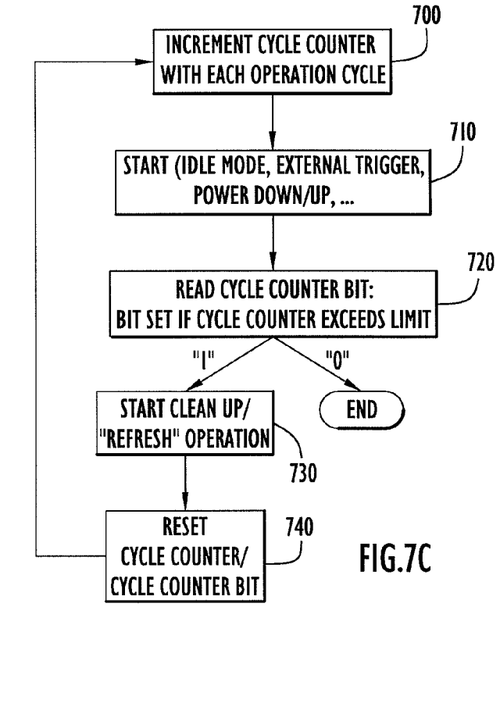

FIG. 7C is a flow chart illustrating the triggering and carrying out of an internal "clean up" operation that can be performed in the memory to restore storage level distributions to acceptable levels, such as those shown in FIG. 7B, in response to a high number of memory cycles. It will be appreciated that the operations shown in FIG. 7C are only one example of how this process can be performed in order to illustrate the concept, and other schemes can be used to carry out this "clean up" task. In operation 700, a cycle counter is incremented each time an operation occurs within the memory or a portion of the memory. For example, a cycle counter may be associated with the memory cells connected to a particular bit line or word line or group or bank of bit lines or word lines, and counts the number of operations (accesses and/or activations) involving these memory cells. If the cycle counter exceeds a predetermined value, a cycle counter bit can be set to indicate that the acceptable number of cycles has been exceeded. For example, the cycle counter bit could be the highest value bit in a register being incremented.

Upon the memory scheduler identifying suitable trigger condition(s) in operation 710 (e.g., idle mode, power up/down, battery charging, or other external trigger commands or signals), the memory scheduler can read the cycle counter bit (operation 720). If the cycle counter bit has been set (e.g., to a logical "1" state), the memory scheduler commands the clean up operation to be performed. On the other hand, if the cycle counter bit is not set (e.g., a logical "0" state), no clean up operation is scheduled.

Note that any of a variety of mechanisms can be used to trigger a clean up operation in response to a cycle count exceeding a desired value. For example, rather than the memory scheduler checking a cycle counter bit after other trigger conditions have been met, a signal can be sent to memory scheduler when the cycle count exceeds a certain value. Another option is for a cycle counter to send the cycle count to the memory scheduler and have the memory scheduler determine from the cycle count whether the cycle count exceeds a limit which triggers a "clean up" operation.

The "clean up" operation 730 performed in response to an excess cycle count can be performed in any of the variety of ways the "clean up" operation is performed in response to an elevated temperature condition described above in connection with the "clean up" operation 630 in FIG. 6C. In particular, if both the "0" bit and the "1" bit storage level distributions require cleaning up, the bit value stored in each memory cell is determined, and a set pulse is applied to each memory cell storing a "1" bit and a reset pulse is applied to each memory cell storing a "0" bit. Another option, as described above, is to apply a set pulse to only those memory cells whose "1" bit storage levels exceed the $SAL_S$ threshold and to apply a reset pulse to only those memory cells whose "0" bit storage levels are below the $SAL_R$ threshold (see FIG. 5C). If a high cycle count affects only one of the storage level distributions (e.g., just the logical "0" storage level distribution or just the logical "1" storage level distribution), then either of these "clean up" schemes can be applied just to the memory cells storing the bits in the logical state affected.

In the implementation shown in FIG. 7C, once the "clean up" operation is completed, the cycle counter can be reset (operation 740) and the cycle counter bit indicating an excess cycle count can be reset, so that the "clean up" operation will not be performed again until the cycle count is incremented from zero to the threshold indicating an excess number of cycles. As previously noted, in other implementations, a cycle counter bit need not be used, and the cycle counter can send a signal or a count to the memory scheduler, and the memory scheduler can schedule "clean up" operations as required in accordance with the priority scheme and availability of suitable conditions (e.g., idle, battery charging, etc.).

As shown in FIG. 7B, once the "clean up" operation has been completed, the improved distributions of the storage levels are more closely clustered around the ideal storage level values, resulting in greater signal margins during read operations and a greatly reduced risk of bit errors. In this example, the distributions of both the "0" bit and the "1" bit storage levels are cleaned up and narrowed; however, as previously explained, it is also possible to "clean up" just the "0" bit distribution or just the "1" bit distribution, which would be desirable if the storage levels of only one of the logical states tended to degrade from high cycle counts.

The internal maintenance tasks described in connection with FIGS. 5A-7C illustrate that a variety of operations can be performed to improve or narrow distribution functions of storage levels as represented by state 410 in FIG. 4 and that these operations can be triggered by a number of different external conditions (e.g., passage of time, elevated temperature, a cycle count exceeding a threshold, etc.). While the foregoing examples illustrate internal maintenance operations in the context of binary memory cells, it will be appreciated that the invention is not limited to memory devices with binary memory cells and is equally applicable to resistive memories with three or more resistance levels representing distinct logical states.

Build-in self test (BIST) and build-in self repair (BISR) are other internal maintenance operations that can be performed within the memory, as represented by state 420 in FIG. 4. Typically, a BIST operation involves an internal pattern generator that generates a test pattern which is clocked into the word lines and bit lines of the memory array. After a certain period of time, an internal read signal is sent and a read operation is performed. The read data is compared to the expected data (the original pattern) in order to try to identify failures of memory cells. BISR operations are performed to repair failed memory cells identified in a previous BIST operation or by other testing. The BISR process typically involves using fuses (e.g., electrical fuses) to activate redundant cells or remapping some addresses (e.g., by making changes in an address multiplexer), which would not be visible to external devices.

Figure 8:
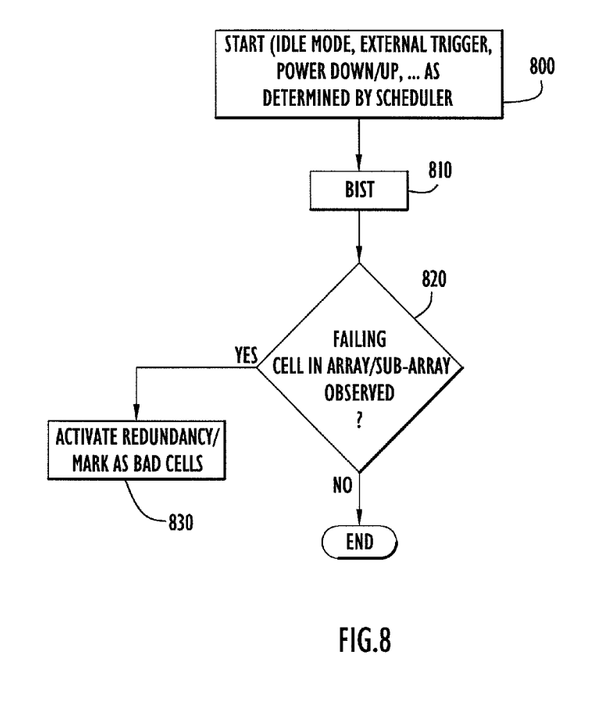
FIG. 8 is a flow diagram illustrating operations performed to carry out a built-in self test (BIST) or built-in self repair in response to certain conditions.

FIG. 8 is a flow diagram illustrating a BIST/BISR operation that can be performed in response to trigger conditions determined by a memory scheduler. In particular, in operation 800, the memory scheduler identifies trigger conditions indicating suitable circumstances for performing a BIST/BISR operation. The trigger conditions can be, for example, idle mode, power up/down, battery charging, or other external trigger commands or signals or combinations thereof. As with the "narrow levels" and "clean up" operations previously described, the BIST/BISR operation can be performed after events such as a certain number of cycles since the last test, a certain number of operating hours since the last test, a certain number of elapsed hours since the last test, excess temperature conditions, etc.

If the trigger conditions are met, a BIST operation 810 is performed to identify defective memory cells. In decision block 820, if a failing cell is observed in the memory array (or sub-array) being tested, in operation 830, the cell is either marked as a defective cell or a redundant cell is activated to replace the defective cell, depending on whether a BISR operation is being performed immediately after the BIST operation (activation) or only the BIST operation is currently being performed (marking). Depending on the particular configuration or architecture or the type of defect detected, cells can be replaced in groups (e.g., all of the cells associated with a particular word line) or individually. Referring again to FIG. 4, in the case where testing such as BIST is performed as a separate operation from repair operations, the internal maintenance tasks associated with repairing defective memory cells (redundancy activation tasks) can be separately scheduled by the memory scheduler, as indicated by state 440.

As previously noted, a BIST operation can be used to identify or "mark" defective memory cells in the memory array. A BISR operation can be used to "repair" defects, essentially by replacing defective memory cells with redundant cells via remapping. One advantage of emerging resistive memory technologies over conventional DRAM technologies is that the number of redundant cells on a DRAM is typically limited by the area consumption and not just the area of cells but the area of optical fuses that need to be blown to activate the redundant cells. These fuses need to be accessed by an optical laser, and the number of redundant cells is typically limited to about 30,000 to 40,000 cells per chip, which takes up a very large area on a DRAM chip. Resistive memory technologies do not require fuses, and spare memory cells can be activated in blocks. Specifically, because resistive memory cells such as those of a PCRAM device are non-volatile, a memory cell itself can be used as a fuse (this is suggested by the reference to "PCRAM fused" in operation 440 in FIG. 4). The absence of bulky fuses makes it much easier to build more redundancy into resistive memories than into conventional DRAM memories.

Another internal maintenance task, shown in operational state 450 in FIG. 4, is "refresh cycles." As previously noted, non-volatile resistive memories do not require periodic refreshing of storage cells in the manner required by volatile memories such as DRAM devices. However, it may be beneficial to occasionally "clean up" storage levels for a variety of reasons, such as those discussed above, and the clean up operation may be carried out in a manner somewhat analogous to a refresh operation. For example, the storage state (logical value) of each memory cell is determined and then a write operation is performed to rewrite the logical value to the memory cell to ensure that the storage level is within an acceptable range.

Refresh cycles can be used in other contexts with resistive memory devices. In particular, to save time and power required for memory accesses, it is possible to program resistance changing memory cells into DRAM-like states (e.g., a partially non-volatile state) which are held for a limited period of time, rather than programming the memory cells into pure non-volatile states. The memory cell's retention time will not be milliseconds like a DRAM memory cells, but perhaps only days or weeks. In this case, weaker or briefer write pulses are used to store information in memory cells, resulting in a partially non-volatile state with less-than-ideal storage levels having a wide distribution.

Such a storage technique is particularly useful with a resistive memory device used in a mobile context to save time and power in writing. There is a tradeoff between the degree of write retention and the operational speed and power required for the write operation. During periods of mobility and use, it is desirable to reduce power consumption to a minimum, so only "weak" zeros and ones are written into the memory cells during active use of the mobile device, with the disadvantage that retention is a few weeks instead of several years. However, the host mobile device must be charged frequently (e.g., each week). When the mobile device is being charged (or during an idle or power down mode), the memory scheduler can take advantage of available power and idle time to "refresh" the memory by re-writing "stronger" ones and zeros at recharging time. The resulting memory cells are then in a fully non-volatile state with a "cleaned up" distribution of levels that is stable over time, making it easier for sense amplifiers to more reliably detect the states of the memory cells in a read operation once the device is activated.

As will be appreciated from the foregoing examples, at least some of the trigger conditions used by the memory scheduler to trigger an internal maintenance operation may include the combination of both an operating state of the resistive memory indicated by an external command and an operating condition of the resistive memory. For example, the operating state can be one or more of: an idle or standby mode, a reduced power mode (e.g., sleep mode, nap mode, hibernation mode, etc.), a battery charging mode, a power up sequence or mode, a power down sequence or mode, and a certain period of I/O inactivity. The operating condition can be one or more of: a time (elapsed time or operating time) since the particular internal maintenance operation was last performed, a number of operations or cycles since the internal maintenance operation was last performed, an operating temperature, and other conditions indicated by a sensor.

Referring again to FIG. 4, any of a variety of other internal maintenance operations can be scheduled by the memory scheduler, as represented by the operational state 430 labeled "other tasks." One such task can be a prefetch operation, which avoids slow memory accesses during read operations. Basically, data which is expect to be read is fetched in a large block from memory cells of the main memory array into a memory that can be accessed more rapidly, such as an SRAM. In the case of a series of related or predictable read accesses, after the initial access, subsequent accesses are made from the faster SRAM rather than directly from the slower storage medium of the main memory array, thereby increasing the overall speed of data retrieval. Such a prefetch scheme may be advantageous in certain contexts with resistive memory devices.

Other internal maintenance tasks can be user initiated. For example, a command can be sent that instructs the scheduler to perform certain tasks, such as defragmenting the memory. The memory scheduler could nevertheless combine such a user-initiated request with other criteria (e.g., idle mode, charging mode, etc.) in determining when to carry out the user-initiated task.

An advantage of a resistive memory device with a memory scheduler for scheduling hidden internal maintenance tasks can be realized in instances where an application or a host device is operating with a timeline that permits DRAM or Flash activities such as refresh or erase. Such timelines provide extra periods of time that are not required by resistive memory devices, during which internal maintenance tasks can be scheduled. More generally, if the memory is intrinsically faster at performing a task (or does not require a task) that an established application calls for, then the memory scheduler can make use of the resulting idle time to perform internal tasks.

For example, Flash memories are relatively slow at performing erase operations (on the order of milliseconds). If a much faster PCRAM device is used in a Flash application, there is a very substantial timing margin during which internal maintenance operations can be performed (e.g., clean up, BIST, prefetch of data, etc.). Likewise, DRAM operation typically requires refresh cycles. During these cycles, the DRAM cannot react to operation requests. If a resistive memory such as a PCRAM device is used in a DRAM application, there is a certain timing margin during which internal maintenance operations can be performed. In other words, the time that would otherwise be used to perform frequent DRAM refresh operations is not required by the PCRAM device, leaving additional time to perform the aforementioned internal maintenance operations. Thus, the memory scheduler aids in permitting devices based on emerging memory technologies such as resistive memory to be substituted for conventional types of memories such as DRAM and Flash memories (e.g., as a drop-in replacement) without modifying the specifications or operating requirements of a host device in which the memory is used. However, it will be appreciated that the invention is not limited to scenarios in which the memory is used as a drop-in replacement.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit, comprising:
a resistive memory comprising an array of resistive memory cells;
a memory controller configured to control operation of the resistive memory in accordance with external commands from an external device; and
a memory scheduler coupled to the resistive memory and the memory controller and configured to schedule internal maintenance operations within the resistive memory in response to trigger conditions indicated by at least one sensor signal or external command, the internal maintenance operations comprising accessing at least a subset of the resistive memory cells in the array, wherein operation of the memory scheduler and the internal maintenance operations are transparent to the external device, and wherein, for each resistive memory cell accessed, the internal maintenance operations comprise:
performing a first read operation by comparing a storage level of the resistive memory cell with a first sense amplifier level;
in response to the first read operation indicating a first logical state, selecting a second sense amplifier level from a plurality of amplifier levels according to the first logical state, wherein the second sense amplifier level is different than the first sense amplifier level;
performing a second read operation by comparing the storage level of the resistive memory cell with the second sense amplifier level; and
performing a write operation to restore a storage level representing the first logical state in the resistive memory cell in response to the second read operation failing to indicate the first logical state.

2. The integrated circuit of claim 1, wherein the memory scheduler requires at least some of the trigger conditions to include a combination of at least one operating state of the resistive memory and at least one operating condition of the resistive memory.

3. The integrated circuit of claim 2, wherein the at least one operating state includes at least one of: an idle mode, a standby mode, a reduced power mode, a battery charging mode, a power up sequence, a power down sequence, and a period of input/output inactivity.

4. The integrated circuit of claim 2, wherein the at least one operating condition includes at least one of: a time since an internal maintenance operation was last performed, a number of operations or cycles since the internal maintenance operation was last performed, an operating temperature, and a condition indicated by sensor.

5. The integrated circuit of claim 1, wherein one of the trigger conditions includes the combination of a battery charging state and input/output inactivity.

6. The integrated circuit of claim 1, wherein the internal maintenance operations include at least one of: an operation to narrow a distribution of storage levels of the resistive memory cells; a resistive memory refresh operation; a built-in self test (BIST) operation; a build-in self repair (BISR) operation; and a prefetch of read data.

7. The integrated circuit of claim 6, wherein the operation to narrow the distribution of storage levels is performed only on the resistive memory cells storing a certain logical state.

8. The integrated circuit of claim 6, wherein the operation to narrow the distribution of storage levels is performed only on the resistive memory cells whose storage levels fall outside a specified range.

9. The integrated circuit of claim 6, wherein the operation to narrow the distribution of storage levels is performed in response to a signal from a temperature sensor.

10. The integrated circuit of claim 1, wherein operation of the memory scheduler and the internal maintenance operation are transparent to the memory controller.

11. The integrated circuit of claim 1, wherein the resistive memory comprises at least one of: a phase change memory device; a conductive bridge memory device, a TMO memory, and a magnetic memory device.

12. A resistive memory device, comprising:
a resistive memory comprising an array of memory cells, each of the memory cells including a resistance changing storage element, the resistive memory being controllable by a memory controller in accordance with external commands from an external device; and
a memory scheduler configured to schedule internal maintenance operations within the resistive memory in response to trigger conditions indicated by at least one sensor signal or external command, the internal maintenance operations comprising accessing at least a subset of the memory cells in the array, wherein operation of the memory scheduler and the internal maintenance operations are transparent to the external device and to the memory controller, and wherein, for each memory cell accessed, the internal maintenance operations comprise:
performing a first read operation by comparing a storage level of the memory cell with a first sense amplifier level;
in response to the first read operation indicating a first logical state, selecting a second sense amplifier level from a plurality of amplifier levels according to the first logical state, wherein the second sense amplifier level is different than the first sense amplifier level;
performing a second read operation by comparing the storage level of the memory cell with the second sense amplifier level;
performing a write operation to restore a storage level representing the first logical state in the memory cell in response to the second read operation failing to indicate the first logical state;
in response to the first read operation indicating a second logical state, selecting a third sense amplifier level from the plurality of amplifier levels according to the second logical state, wherein the third sense amplifier level is different than the second sense amplifier level;
performing a third read operation by comparing the storage level of the resistive memory cell with the third sense amplifier level; and
performing a write operation to restore a storage level representing the second logical state in the memory cell in response to the third read operation failing to indicate the second logical state.

13. The resistive memory device of claim 12, wherein the resistive memory device comprises a phase change memory (PCRAM) device.

14. A system, comprising:
a host;
a resistive memory comprising an array of resistive memory cells;
a memory controller configured to control operation of the resistive memory in accordance with external commands from the host; and
a memory scheduler coupled to the resistive memory and the memory controller and configured to schedule internal maintenance operations within the resistive memory in response to trigger conditions indicated by at least one sensor signal or external command, the internal maintenance operations comprising accessing at least a subset of the resistive memory cells in the array, wherein operation of the memory scheduler and the internal maintenance operations are transparent to the host, and wherein, for each resistive memory cell accessed, the internal maintenance operations comprise:
performing a first read operation by comparing a storage level of the resistive memory cell with a first sense amplifier level;
in response to the first read operation indicating a first logical state, selecting a second sense amplifier level from a plurality of amplifier levels according to the first logical state, wherein the second sense amplifier level is different than the first sense amplifier level;
performing a second read operation by comparing the storage level of the resistive memory cell with the second sense amplifier level; and
performing a write operation to restore a storage level representing the first logical state in the memory cell in response to the second read operation failing to indicate the first logical state.

15. The system of claim 14, wherein the memory scheduler and memory are contained in a memory chip.

16. The system of claim 14, wherein the resistive memory, the memory scheduler, and the memory controller are disposed on a memory module.

17. A method of scheduling internal maintenance operations in a resistive memory, the method comprising:
receiving at a memory scheduler at least one sensor signal or external command indicative of an operating state of the resistive memory or an operating condition;
scheduling internal maintenance operations within the resistive memory in response to trigger conditions determined by the memory scheduler from the at least one sensor signal or external command, the internal maintenance operations comprising accessing a plurality of resistive memory cells in the resistive memory, wherein operation of the memory scheduler and the internal maintenance operations are transparent to external devices, and wherein, for each resistive memory cell accessed, the internal maintenance operations comprise:
performing a first read operation by comparing a storage level of the resistive memory cell with a first sense amplifier level;
in response to the first read operation indicating a first logical state, selecting a second sense amplifier level from a plurality of amplifier levels according to the first logical state, wherein the second sense amplifier level is different than the first sense amplifier level;
performing a second read operation by comparing the storage level of the resistive memory cell with the second sense amplifier level; and
performing a write operation to restore a storage level representing the first logical state in the resistive memory cell in response to the second read operation failing to indicate the first logical state.

18. The method of claim 17, wherein scheduling the internal maintenance operations includes requiring at least some of the trigger conditions to include a combination of at least one operating state of the resistive memory and at least one operating condition of the resistive memory.

19. The method of claim 18, wherein the at least one operating state includes at least one of: an idle mode, a standby mode, a reduced power mode, a battery charging mode, a power up sequence, a power down sequence, and a period of input/output inactivity.

20. The method of claim 18, wherein the at least one operating condition includes at least one of: a time since an internal maintenance operation was last performed, a number of operations or cycles since the internal maintenance operation was last performed, an operating temperature, and a condition indicated by sensor.

21. The method of claim 17, wherein one of the trigger conditions includes the combination of a battery charging state and input/output inactivity.

22. The integrated circuit of claim 1, wherein for each resistive memory cell accessed, the internal maintenance operations further comprise:
in response to the first read operation indicating a second logical state, selecting a third sense amplifier level from the plurality of amplifier levels according to the second logical state, wherein the third sense amplifier level is different than the second sense amplifier level;
performing a third read operation by comparing the storage level of the resistive memory cell with the third sense amplifier level; and
performing a write operation to restore a storage level representing the second logical state in the resistive memory cell in response to the third read operation failing to indicate the second logical state.

23. The system of claim 14, wherein for each resistive memory cell accessed, the internal maintenance operations further comprise:
in response to the first read operation indicating a second logical state, selecting a third sense amplifier level from the plurality of amplifier levels according to the second logical state, wherein the third sense amplifier level is different than the second sense amplifier level;
performing a third read operation by comparing the storage level of the resistive memory cell with the third sense amplifier level; and
performing a write operation to restore a storage level representing the second logical state in the resistive memory cell in response to the third read operation failing to indicate the second logical state.

24. The method of claim 17, wherein for each resistive memory cell accessed, the internal maintenance operations further comprise:
in response to the first read operation indicating a second logical state, selecting a third sense amplifier level from the plurality of amplifier levels according to the second logical state, wherein the third sense amplifier level is different than the second sense amplifier level;
performing a third read operation by comparing the storage level of the resistive memory cell with the third sense amplifier level; and
performing a write operation to restore a storage level representing the second logical state in the resistive memory cell in response to the third read operation failing to indicate the second logical state.

* * * * *